(12) United States Patent
Dokken et al.

(10) Patent No.: US 8,060,851 B2
(45) Date of Patent: Nov. 15, 2011

(54) METHOD FOR OPERATING A SECURE SEMICONDUCTOR IP SERVER TO SUPPORT FAILURE ANALYSIS

(75) Inventors: Richard C. Dokken, San Ramon, CA (US); Gerald S. Chan, Saratoga, CA (US); Jacob J Orbon, Morgan Hill, CA (US); Alfred L Crouch, Cedar Park, TX (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 1013 days.

(21) Appl. No.: 11/850,342

(22) Filed: Sep. 5, 2007

(65) Prior Publication Data
US 2010/0031092 A1 Feb. 4, 2010

Related U.S. Application Data

(60) Provisional application No. 60/829,317, filed on Oct. 13, 2006.

(51) Int. Cl.
*G06F 17/50* (2006.01)
(52) U.S. Cl. .......................... 716/136; 716/139
(58) Field of Classification Search ........................ None
See application file for complete search history.

(56) References Cited

U.S. PATENT DOCUMENTS

| | | | | |
|---|---|---|---|---|
| 4,342,029 A | * | 7/1982 | Hofmanis et al. | 345/22 |
| 6,578,174 B2 | * | 6/2003 | Zizzo | 716/103 |
| 6,970,815 B1 | * | 11/2005 | Bombal et al. | 703/15 |
| 7,146,584 B2 | * | 12/2006 | Varney | 716/103 |
| 7,222,312 B2 | * | 5/2007 | Ferguson et al. | 705/51 |
| 7,353,468 B2 | * | 4/2008 | Ferguson et al. | 716/102 |

OTHER PUBLICATIONS

Crouch et al., "Processing High Volume Scan Test Results for Yield Learning," Proc. 8th Int'l Symposium on Quality Electronic Design (ISQED'07), 2007 IEEE, 6 pages.*
Kuji et al., "FINDER: A CAD System-Based Electron Beam Tester for Fault Diagnosis of VLSI Circuits," IEEE Trans. on CAD, vol. CAD-5, No. 2, Apr. 1986, pp. 313-319.*
Miura et al., "Automatic EB Fault Tracing System by Successive Circuit Extraction from VLSI CAD Layout Data," 1997 IEEE, pp. 162-167.*

* cited by examiner

*Primary Examiner* — Leigh Garbowski
(74) *Attorney, Agent, or Firm* — Holland & Hart, LLP

(57) ABSTRACT

A method for operating a secure semiconductor IP access server to support failure analysis. A client presents a test failure and failure type to an automated server which traverses an electronic product design, definition, and test database to report specifically those components and interconnect likely to cause the failure with geometrical information which may be displayed on the client. Other aspects of semiconductor IP are protected by the server by limiting the trace mechanism and renaming components.

15 Claims, 5 Drawing Sheets

METHOD FOR OPERATING A SECURE SEMICONDUCTOR IP SERVER TO SUPPORT FAILURE ANALYSIS

REFERENCE TO CO-PENDING APPLICATIONS

This application claims the benefit of U.S. Provisional Application No. 60/829,317, filed Oct. 13, 2006. This application is related to U.S. application Ser. No. 11/682,314, filed Mar. 6, 2007.

BACKGROUND

Increasing Complexity of Semiconductor Manufacturing—The transistor was invented in 1947 at Bell Telephone Laboratories by a team led by physicists John Bardeen, Walter Brattain, and William Shockley. Almost every piece of equipment that stores, transmits, displays, or manipulates information in the sixty years hence has at its core silicon chips filled with electronic circuitry. These chips have dramatically scaled to many millions of transistors and miles of interconnect. A global network of independent but cooperative entities and technologists has provided this solution by specialization and business process integration.

Over the years market opportunities have created niches for deep competencies to profitably support analog and digital designers with tools including time domain and frequency domain analysis, multiple levels of abstraction from physical layout to behavioral specification, and supporting infrastructure such as test, measurement, and failure analysis. Every step in the complex manufacturing process has evolved to improve quality and productivity in dramatic acceleration and volume. Procedures that were once handcrafted have become automated. Designs that were once uniquely customized have become standard components which plug and play within larger systems. Tools which were islands of automation now fit with design flows.

Continuous improvement in product quality and manufacturing efficiency has been driven by adopting new materials and new ways to work. To achieve density more information and control over the semiconductor material and processes need to be measured, understood, and managed within each discipline. And to obtain overall success and timeliness, better communication has been extended upstream and downstream in the tool chains and the supply and design organizations.

Electronic Product Definition Design and Test Database—For every product brought to market there is a virtual electronic product definition design and test database which may not exist in any one place or time but reflects all the steps by every contributor.

Simple tool files optimized for function—Originally there were and in some specialized domains still are tools built for a single purpose which have a simple file optimized to the function needed by the owner/user. These user/developers change the files whenever they need to enhance their tool or correct bugs.

Translation between proprietary files to exchange data—As an electronic product moves from one level of abstraction to a more realized level, it has been convenient to translate from one proprietary file format to another. Very successful tools have become de jure standards because other toolmakers pragmatically adapt to what their customers have adopted. Standards bodies sometimes adopt or extend the file formats which are most popular. In other cases a compromise between multiple camps and experts is negotiated under some voting process. An example of a file format used to exchange information from one tool to another which has become both standard and open is LEF/DEF the library exchange format/design exchange format.

Integration within larger vendors to multi-use binary databases with API—But file formats are slow to change to accommodate new requirements and may be slow to read or write. Within a tool vendor which has acquired or developed a suite of tools, it is compelling to maintain information common to a number of products within a single data format and define application programming interfaces (APIs) to their teams of toolmakers. Integrating and selling their own downstream tool is thus generally less challenging than translating a file from or to a competing vendor's format. Performance within a tool and across multiple tools is improved by using an API rather than writing or reading an external file.

Open standards in files, databases, and API's—Some customers and smaller tool vendors advocate an open standard binary database with an independently defined API rather than waiting for a larger tool vendor to accommodate their needs. As new requirements and materials emerge from the laboratory however, there will continue to be some mix of de facto and de jure standards in file format, binary databases, and API's to describe an electronic product and capture all the data related to its manufacturing, test, and analysis.

Failure Analysis Across Disciplines and Entities: Test, Physical Layout, and Design.

An important function for improving reliability, quality, cost, and productivity is failure analysis. Failure analysis is by its nature cross disciplinary because the source of the failure is to be discovered. Failure analysis requires access to and integration of information created by or used for test, physical layout, and the original design team among others. Failure analysis is costly and must be applied to the most compelling issues facing an entity whether it be customer satisfaction, cost, or productivity.

Multi customer foundry and IP owners—It can be appreciated by those knowledgeable in the art that a failure analysis engineer who is an employee of a vertically integrated semiconductor manufacturer, working at a foundry owned by the vertically integrated semiconductor manufacturer, and co-located with product engineers and design engineers with access to tools sold by leading electronic design automation vendors may conceptually, have full access, but pragmatically, suffer little or no access to the entire test, layout, and design databases; and today must request help from his colleagues in navigating through the file system to narrow his analysis candidates. Even enabled via corporate access control policies, the foundry engineer may not be familiar with the design files—it is not information that his job function is familiar with. The Foundry engineer is interested in the X-Y location, metal layer, process step, or mask layer—not the information provided by many design files (gates, nets, flip-flops, etc.).

While there remain vertically integrated semiconductor manufacturers and computer manufacturers, it is common to find a complex supply chain that supports semiconductor manufacturing with fabrication, test, packaging, and distribution services. Any member of the supply chain may presently have customers who compete with one another and whose alliances will change over time. Some of the members of the supply chain may become a competitor to a former customer or even compete with their customer while remaining a supplier. Failure analysis can be performed at a number of points in the supply chain. A foundry in the Far East may prefer to perform failure analysis while the lots are still in the manufacturing area without disturbing its customer or waiting for information from half the world away on a different holiday or vacation schedule. Yet the owner of the semiconductor IP has valid business and technical reasons inhibiting the transfer of the entire test, manufacturing, and design database necessary to perform a failure analysis. Even if agreeable in spirit such a transfer may introduce delay to learn the motivation which simply could be an embarrassing error which is culturally unacceptable. Furthermore, transferring terabytes of data to analyze is itself punishing to all concerned.

Electronic databases for integrated circuits are now very large and are difficult to send entirely. Furthermore, some steps of the manufacturing process are economically performed globally and through supplier-vendor relationships. Some semiconductor IP owners may not consider it prudent to transfer an entire database of design files to a business partner who may be a present or future competitor or who serves or will serve competitors. It is certainly not convenient for either party. Yet improvements in yield benefit all parties and the delay in resolving problems are costly.

Thus it can be appreciated that what is needed is a way to provide only the information that a failure analysis engineer needs to identify the source of a problem in manufacturing or design, by extracting relevant data from an Electronic Product Definition Design and Test Database which may exist as an ad hoc combination of files and databases in many formats and may further contain semiconductor intellectual property which the owner wishes protected as a trade secret with minimal intervention of the product or design teams.

SUMMARY OF THE INVENTION

The present invention for operating a secure semiconductor IP access server to support failure analysis is a process which has methods for receiving a failure and failure type recorded on a tester; accessing information in an electronic product design, definition and test database; tracing interconnect and components which potentially contribute to a failure and failure type; and storing the localized area in which a defect could cause such a failure.

By localized area we mean the origin, length, layer, and direction of wire segments, the location and dimension of vias attached to the wire segments, the location and dimension of pins attached to the wire segments, and the origin, orientation, and dimension of components which potentially contribute to a failure.

The invention further comprises defining boundaries around semiconductor intellectual property that the owner declines to reveal to an unauthorized person and stopping the trace when such a boundary is encountered.

The invention further comprises displaying graphically the origin of scan cells, the origin of components potentially contributing to a failure in a scan cell, the location of pins on the components, and the location of interconnect elements attached to the pins.

The present invention builds on techniques to convert test pattern failures logged by Automatic Test Equipment (ATE) to failing scan cells for DFT-based Structural test patterns. These signatures of failing scan cells can further be analyzed to deduce electrical faults down to a fairly narrow scope of components and interconnects. These narrow electrical circuits have been termed as "Splats" by Inovys Corporation. In an embodiment Splats are identified; and detailed graphical representations are transmitted in an IP-Secure safe manner by combining selected elements from the following sources:
    Test pattern data in Standard Test Interface Language (STIL) format
    Test pattern failure data from ATE
    Electrical library definitions in Library Exchange Format (LEF)
    Electrical component and interconnect placement in Design Exchange Format (DEF)

This proof of concept illustrates practicing the present invention on an ad hoc aggregation of simple text files which comprise an Electronic Product Definition Design and Test Database which may be assembled from separate vendors and tools. The present invention applies equally to a standard or proprietary database containing the same information and accessed through an application programming interface. Or equivalently, an Electronic Product Definition Design and Test Database for a chip may comprise a combination of at least one simple text file and at least one standard or proprietary database accessed through an application programming interface.

The security of the semiconductor intellectual property is enhanced by the further step of replacing the hierarchical name of each cell instance or each net with a unique alias name. The security of the semiconductor intellectual property is enhanced by a process having the steps of defining a limit at a physical or hierarchical boundary which is desired to be kept confidential, checking for the limit before each step of the trace algorithm, and terminating the trace.

References to the Library Exchange Format (LEF), the Design Exchange Format (DEF), the Standard Test Interface Language (STIL), and Graphical Data System (GDS) in the following are meant not to be restrictive but illustrative of the wide variety of data formats used in Electronic Product Design, Definition, and Test Databases which include proprietary binary formats controlled by standards organizations and large design automation software developers.

The present invention limits exposure of semiconductor intellectual property by only tracing the circuit elements implicated in a specific test failure, and creating alias names for hierarchical instantiated names, and storing only origin and dimension information of components and interconnect relevant to a specific test failure. The invention further protects semiconductor IP by controlling the trace request by first checking against a physical or hierarchical boundary defined to protect trade secrets.

DETAILED DESCRIPTION

Figure 1:
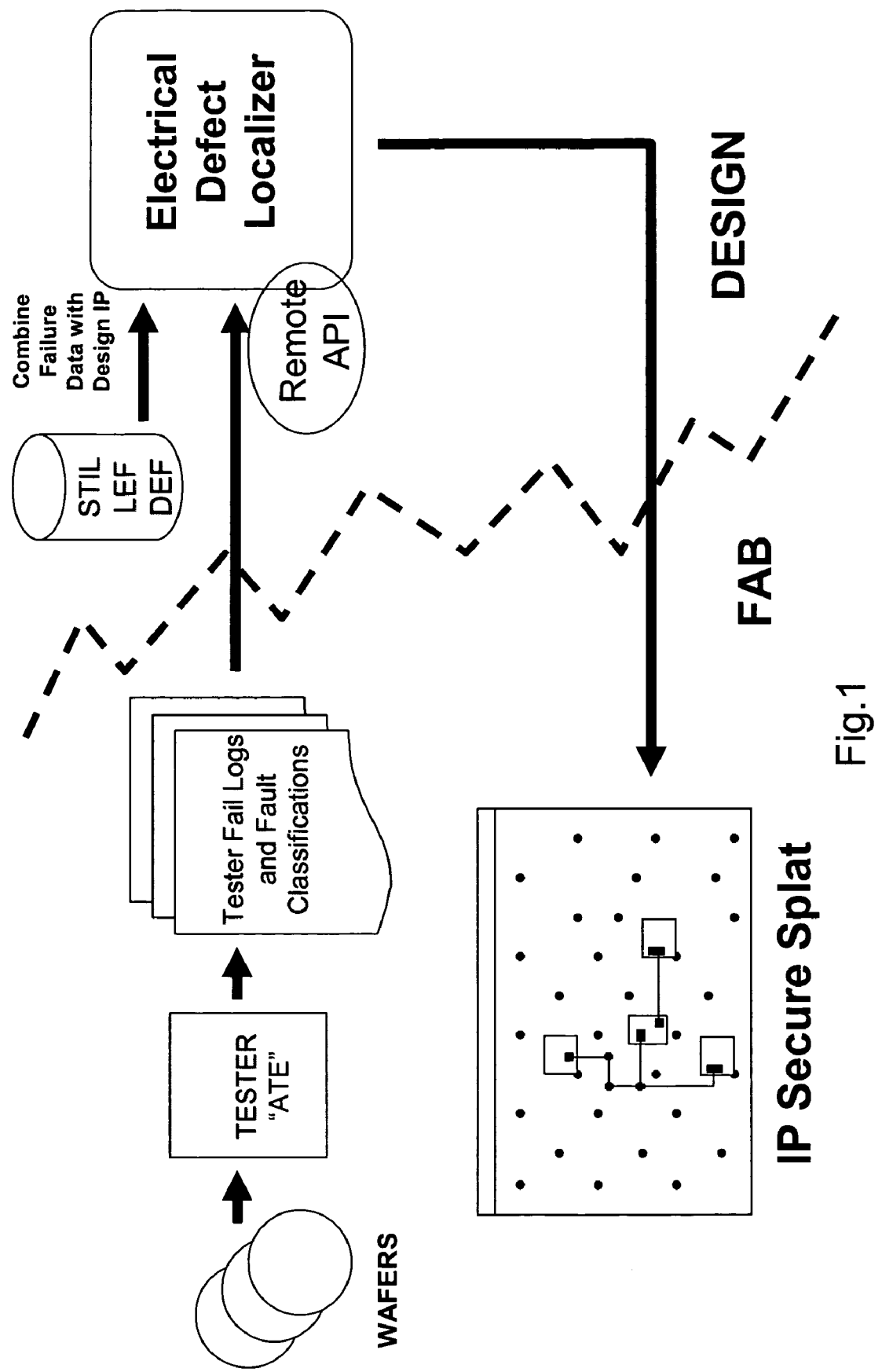
FIG. 1 is a block diagram of a system for secure semiconductor IP access.
Figure 2:
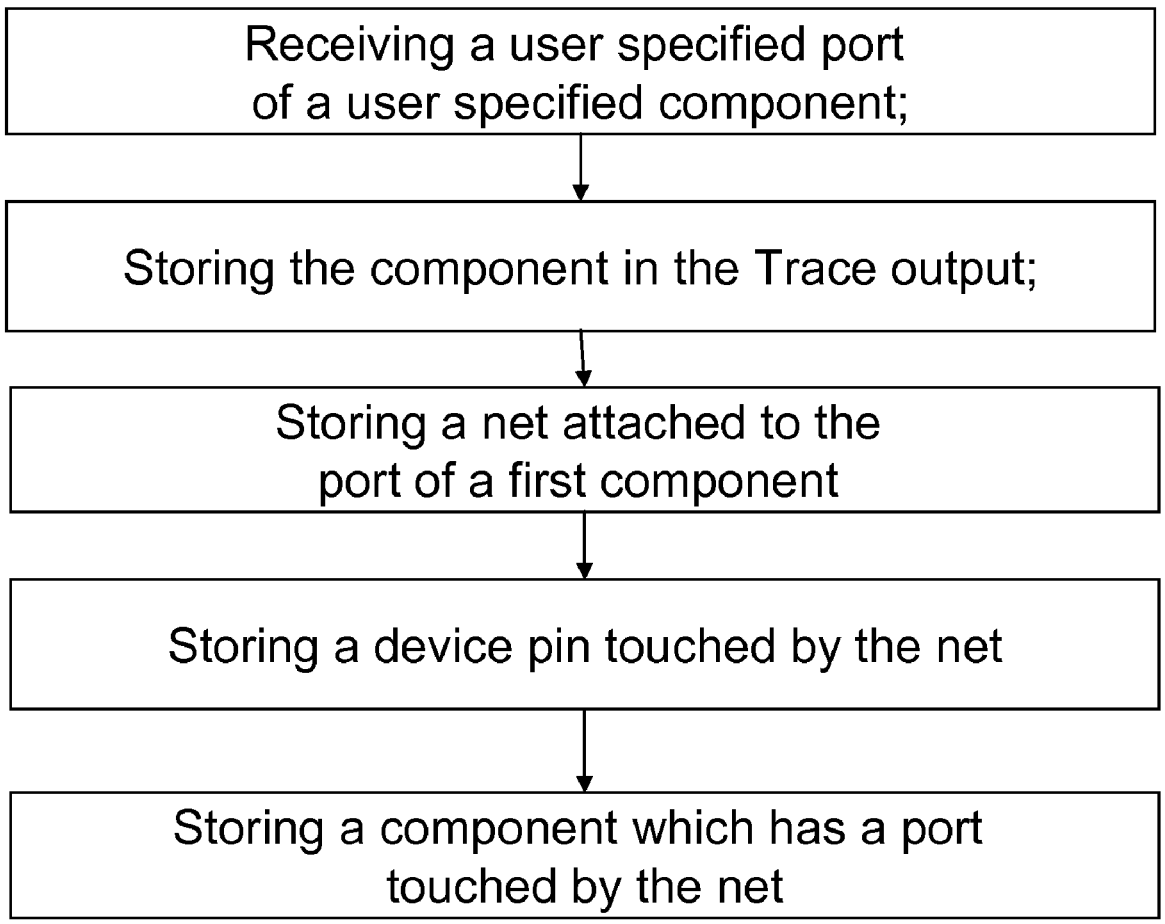
FIG. 2 is a flowchart of net print tracing.
Figure 3:
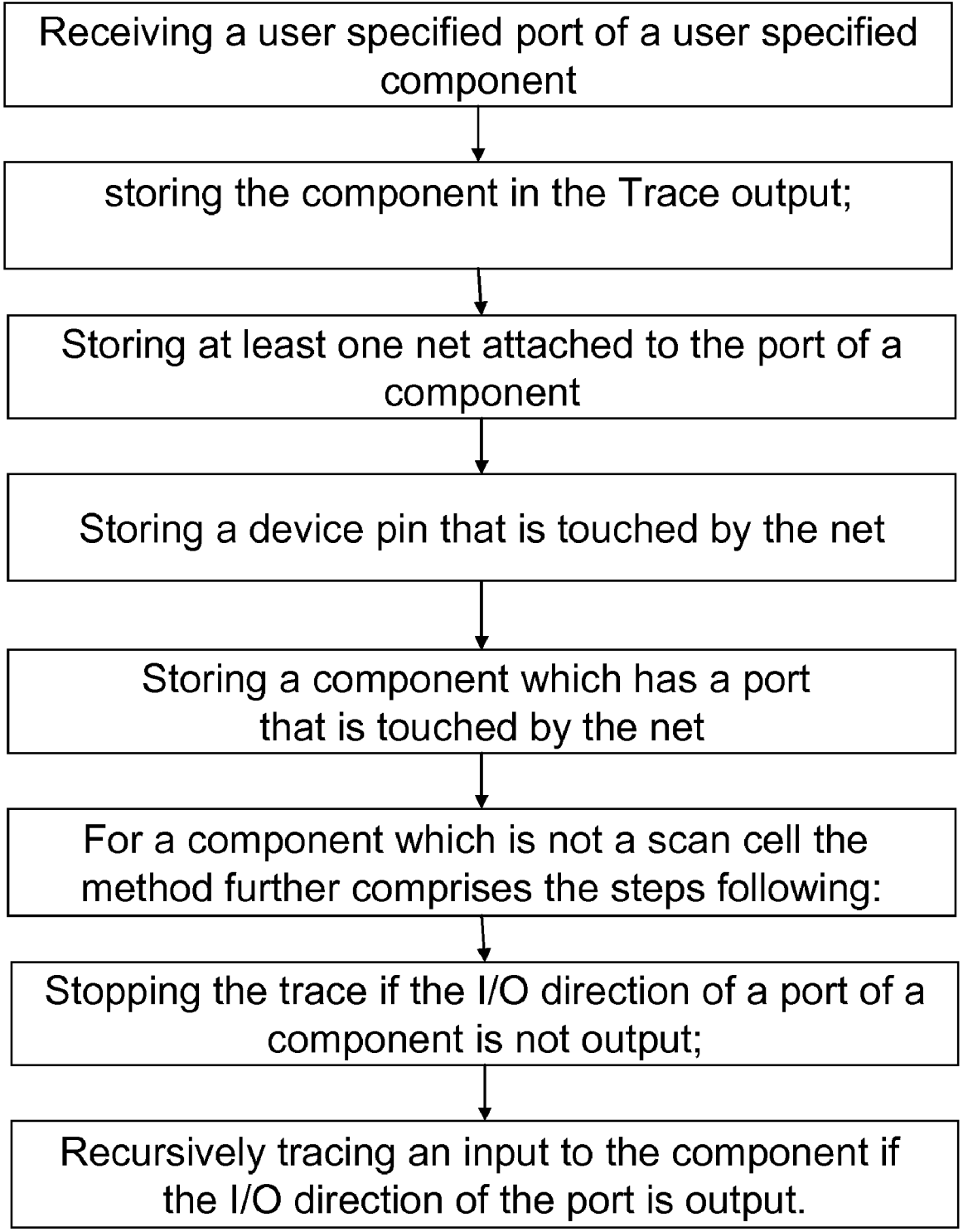
FIG. 3 is a flowchart of fan-in tracing.
Figure 4:
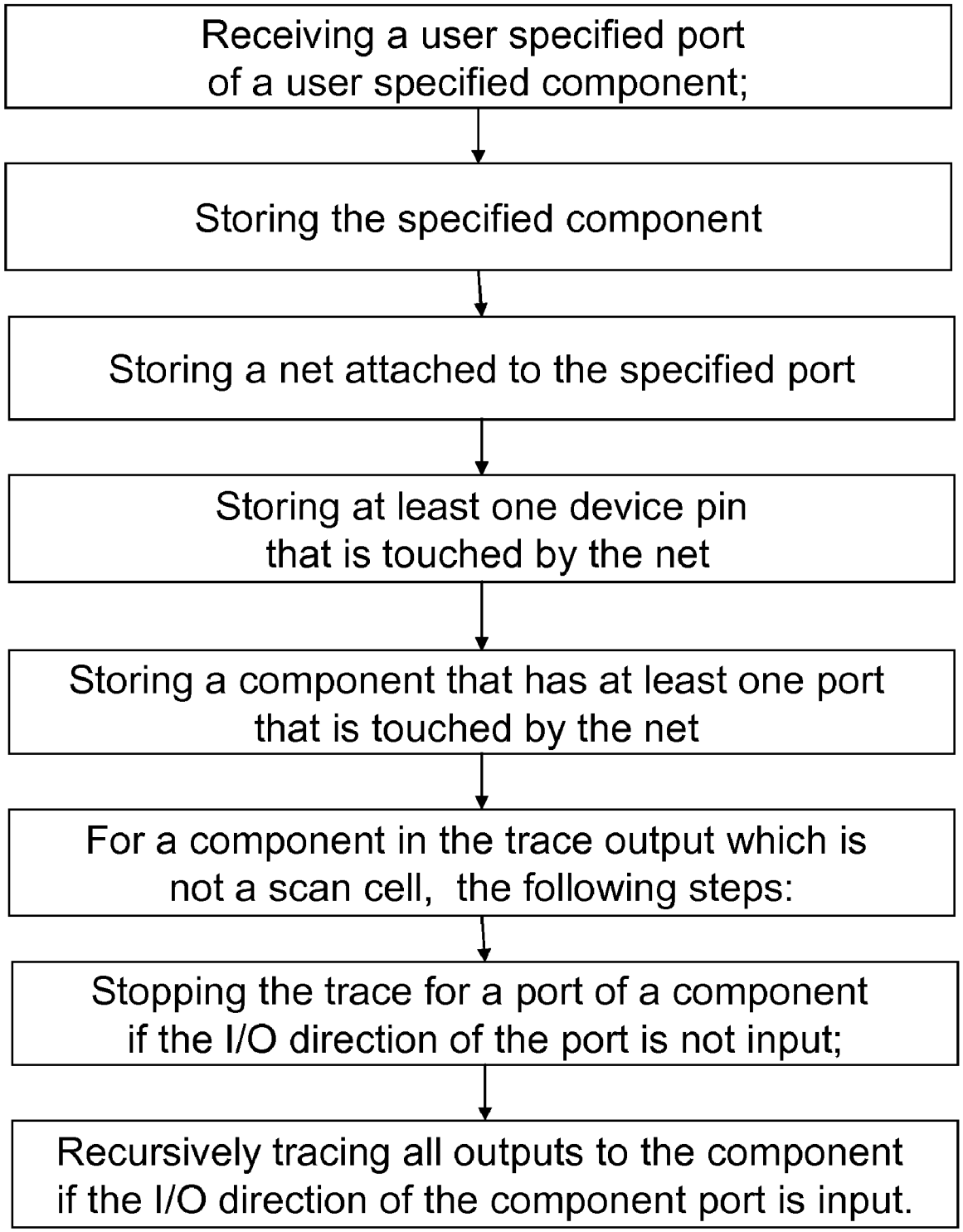
FIG. 4 is a flowchart of fan-out tracing.
Figure 5:
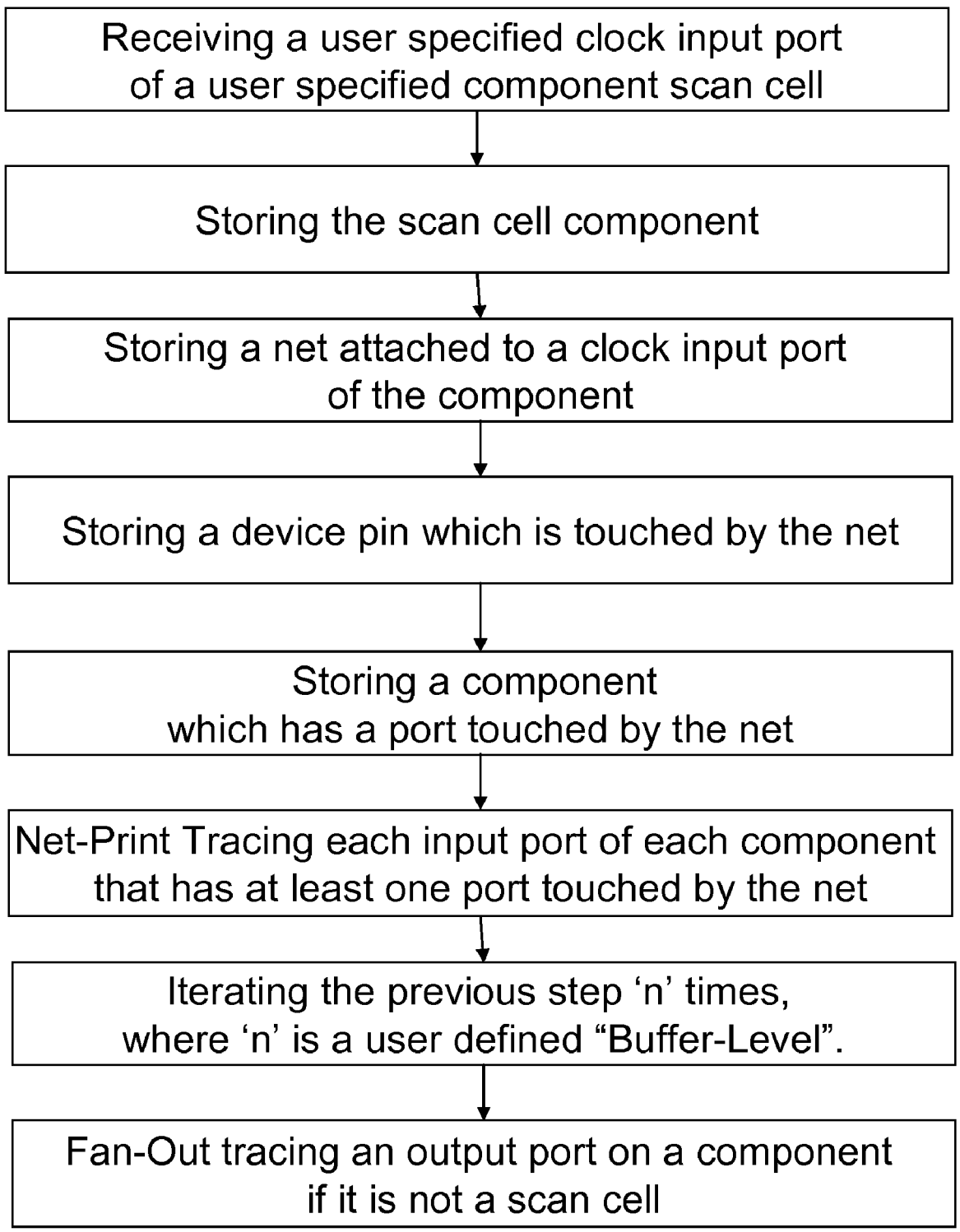
FIG. 5 is a flowchart of clock-tree tracing.

We disclose the invention first with a first mode or embodiment as follows:
Process for operating a secure semiconductor IP access server:
    Step 1: Associating all Scan Cells to Components
    A test pattern generated in STIL or equivalent contains scan structure information, including names for all scan cells.

Layout information formatted in DEF or equivalent will contain the following for each component instance of a library element:

Component instance name, with design hierarchy
Library model name
Component location and orientation The DEF or equivalent file will contain all instances of placed library elements. This will include elements such as AND-Gates, OR-Gates, FLIP-FLOPS. Each FLIP-FLOP may be a scan cell. Thus, all scan cells can be mapped to a sub-set of DEF Components.

Step 2: Painting a Background of Scan Cell Coordinates

After all scan cells are associated to a corresponding DEF Component, the origin for each scan cell is known. By storing the X/Y coordinate for each, a graphical picture can be constructed showing all scan cell placements. At this point, geometry of each scan cell is not important, and the origin will be marked with a simple dot. This pattern shows the shape of logic blocks in the layout, as well as white space for areas void of scan cells such as memory and analog circuitry.

Step 3: Colorizing Passing Vs. Failing Scan Cells

By using the pass/fail information from test equipment, failing scan cell origins can be painted in an intuitive color such as red, to distinguish from non-failing scan cell origins which can be painted in a contrasting color.

Step 4: Applying Circuit Detail to Failing Area

By analyzing the failing scan cells, a fault region, or Splat, can be deduced using available techniques such as those described in "A process for improving design-limited yield by localizing potential faults from production test data." The following circuit detail must be gathered from the LEF and DEF source to enable the Splat drawing:

For each listed failing component, the model name is retrieved from the DEF file
i. For each model, the following information is retrieved from the LEF file
  1. The geometric shape and size of the model
  2. All of the named pins (connection points) for the model
  3. The geometric shape and size of each pin
Using all of the detailed model information collected from the previous step, each component in the Splat can then be accurately drawn revealing shape and size of the component as well as shape and size of each pin on the component
The net wire routes connecting the components in the Splat are fetched from the DEF file gathering the following:
  1. Length and metal layer of each segment in the wire route
  2. Named vias which connect a wire route segment from one metal layer to a wire route segment on another metal layer
  3. Each net wire route segment in the Splat can then be drawn applying a unique color per metal layer
Via geometric size and shape is retrieved from either LEF or DEF files and are drawn as located within the nets.

The invention further comprises:

Step 5: Encrypting Scan Cell Names

For each scan cell drawn in the physical view of the die map, the design hierarchical name is removed and replaced with an encrypted name such as c13b827. In this example, 'c' means chain followed by a numerical index for the chain, and 'b' means bit number followed by a numerical index of the bit position in the chain. This encryption removes all design content, however, allows for this content to be added back into the display if it is available.

The present invention is a method comprising the following steps:
receiving a failure and failure type measured on a tester;
accessing information in an electronic product design, definition and test database;
tracing interconnect and components which potentially contribute to a failure and failure type; and
storing the localized area in which a defect could cause such a failure wherein storing the localized area comprises storing on computer readable electronic media data concerning the origin, length, layer, and direction of wire segments, the location and dimension of a via, if any, attached to the wire segments, the location and dimension of pins attached to the wire segments, and the origin, orientation, and dimension of components which potentially contribute to a failure.

By tracing we mean the steps previously described in the associated co-pending patent application "A process for improving design-limited yield by localizing potential faults from production test data" 11682314 first named inventor Dokken, Richard C, file date Mar. 6, 2007 hereby incorporated by reference.

More specifically, at least one of four trace methods are applied to a failure and failure type reported from semiconductor testing. The failure types suggest a trace strategy as follows:

Unresolved Broken Scan Chains are traced with the Fan-In from the Scan Data Out Pin, through the scan chain ports on the scan flip-flops and continuing until the Scan Data In Pin.
Resolved Broken Chain: Broken scan chains are traced with the Fan-Out trace on the scan output of the identified scan cell where the break occurs.
Raw Stuck: All failing scan cells are traced with the Fan-In trace on the 'D' input.
Diagnosed Stuck: The Net-Print trace is performed for each component/port fault candidate.
Raw Delay: The Clock-Tree Trace is performed for on the clock input of each failing scan cell. Further, the Fan-In Trace is performed on the 'D' input for each failing scan cell.
Path Delay: The Clock-Tree Trace is performed for on the clock input of each failing scan cell. Further, the Fan-In Trace is performed on the 'D' input for each failing scan cell.
Tracing Net-Print—
A net is described as the metal wire and via network that connects a component and port (or pin) to other points, such as points on other components or device pins. A Net-Print Trace operation begins at a user specified port of a user specified component. The component at the Trace origin is included in the Trace output. The net attached to the origin component/port is included in the Trace output. The device pins that are touched by the net are included in the Trace output. The components that have ports that are touched by the net are included in the Trace output
Tracing Fan-In—
A Fan-In Trace operation begins at a user specified port of a user specified component. The component at the Trace origin is included in the Trace output. The net attached to the origin component/port is included in the Trace output. The device pins that are touched by the net are included in the Trace output. The components that have ports that are touched by the net are included in the Trace output. Each of the attached components that are not scan cells are further Traced as follows:

If the I/O direction of the component port is not output, the Trace through this path is stopped If the I/O direction of the component port is output, all inputs to the component are further Traced as recursive Fan-In operations Tracing Fan-Out—

A Fan-Out Trace operation begins at a user specified port of a user specified component. The component at the Trace origin is included in the Trace output. The net attached to the origin component/port is included in the Trace output. The device pins that are touched by the net are included in the Trace output. The components that have ports that are touched by the net are included in the Trace output. Each of the attached components that are not scan cells are further Traced as follows:

If the I/O direction of the component port is not input, the Trace through this path is stopped If the I/O direction of the component port is input, all outputs to the component are further Traced as recursive Fan-Out operations Tracing a Clock-Tree—

A Clock-Tree Trace operation begins at a user-specified clock input port of a user-specified component scan cell. The scan cell component at the Trace origin is included in the Trace output. The net attached to the origin component/clock-port is included in the Trace output. The device pins that are touched by the net are included in the Trace output. The components that have ports that are touched by the net are included in the Trace output. For each component which has a port that is touched by the net, a Net-Print Trace will be performed on at least one input port. The previous step iterates 'n' times, where 'n' is a user defined "Buffer-Level". Each output port on each of the Traced components which are not scan cells are further Traced with a Fan-Out Trace Tracing comprises at least one of the following methods: net-print tracing; fan-in tracing; fan-out tracing; and clock-tree tracing.

Net-Print Tracing comprises:

receiving a user specified port of a user specified component;

storing the component in the Trace output;

storing a net attached to the port of a first component in the Trace output wherein a net comprises at least one metal wire which connects a component and port (or pin) to at least one of the following: a via, a device pin, and a port on a second component;

storing a device pin touched by the net in the Trace output; and storing a component which has a port touched by the net in the Trace output.

Fan-In Tracing comprises:

receiving a user specified port of a user specified component;

storing the component in the Trace output;

storing at least one net attached to the port of a component in the Trace output;

storing a device pin that is touched by the net in the Trace output;

storing a component which has a port that is touched by the net in the Trace output;

for a component in the Trace output which is not a scan cell the method further comprises the steps following:

stopping the trace if the I/O direction of a port of a component is not output; and recursively tracing an input to the component if the I/O direction of the port is output.

Fan-Out Tracing comprises:

receiving a user specified port of a user specified component;

storing the specified component in the Trace output;

storing a net attached to the specified port in the Trace output;

storing at least one device pin that is touched by the net in the Trace output storing a component that has at least one port that is touched by the net in the Trace output;

for a component in the trace output which is not a scan cell, the method further comprises the following steps:

stopping the trace for a port of a component if the I/O direction of the port is not input; and recursively tracing all outputs to the component if the I/O direction of the component port is input.

Clock-Tree Tracing comprises:

receiving a user specified clock input port of a user specified component scan cell;

storing the scan cell component in the Trace output;

storing a net attached to a clock input port of the component in the Trace output;

storing a device pin which is touched by the net in the Trace output;

storing a component which has a port touched by the net in the Trace output;

tracing each input port of each component that has at least one port touched by the net, wherein tracing is the Net-Print Tracing method; and iterating the previous step 'n' times, where 'n' is a user defined "Buffer-Level".

The clock tree tracing method further comprises tracing an output port on a component in the trace output if it is not a scan cell wherein tracing comprises the Fan-Out Tracing method.

Tracing a test failure to a localized fault region further comprises the following process: reading from a library database and storing a geometric shape and size of a cell, a named pin for a cell, a geometric shape and size of a pin of the cell.

Tracing a test failure to a localized fault region further comprises the following process: reading from a design database and storing length and metal layer of each segment of a wire route connecting cells in a localized fault region.

Tracing a test failure to a localized fault region further comprises the following process: reading from a library database and storing geometric size, and shape of a via connecting a wire route segment from one metal layer to a wire route segment on another metal layer and reading and storing the via's location from a design database.

By associating a test pattern scan cell with an instantiated component name we mean the following process:

reading a net list name for a scan cell from a test pattern scan structure file, reading a component instance name from a design exchange format file, reading a component location and orientation from a design exchange format file, reading a component model name from a design exchange format file, reading attributes (size shape, pin name size, orientation and locations) for a model name component from a lef file, storing on computer readable media the hierarchical instance name, location and orientation (pins and their locations) of a scan cell read from a test pattern scan structure file.

By aliasing a name we mean a method of conventional pseudo-naming known to those skilled in the art which include the following methods:

substituting a scan chain and bit index for the hierarchical portion of an instantiated scan cell name, replacing the hierarchical portion of an instantiated cell name with a pseudo-randomly generated name, hashing at least a portion of an instantiated cell name, hashing the name of at least one of a pin, a via, and a net wire route segment whereby implications of the design intent of the circuit is hidden from attempts at reverse engineering.

The invention tangibly embodied in a computer program controlling a processor includes the step of storing to computer readable media a splat wherein a splat comprises a location of the origin of a library cell wherein a location is a 2 dimensional geometric coordinate, its length, and its width; and a location of the origin of net wire route segment, its metal layer, length, and direction.

The method is improved by the step of associating a distinguishing property to a failing library cell whereby a passing scan cell may be visually distinguished from a failing scan cell wherein passing and failing characteristics are derived from results of applying test patterns on semiconductor manufacturing automated test equipment apparatus.

The method includes localizing a plurality of scan cell origins with a visual icon without geometric size and visually distinguishing a passing scan cell from a failing scan cell wherein a scan cell is a library cell associated with a test pattern scan structure whereby a graphical picture can be constructed showing scan cell placements with a dot, the dot painted in an intuitive color symbolizing a passing or failing test result.

A method for displaying a splat, whereby an analyst from a partner entity may have limited visibility into the semiconductor intellectual property of a remotely located principal entity, has the steps of reading a localized fault region file;

displaying a background of scan cell origins in a grid;

visually distinguishing passing scan cells from failing scan cells;

displaying location, geometric size, and shape of at least one AND-gate, OR-gate, pin, net wire route segment, and via within the localized fault region file; and visually distinguishing the metal layer property of a net wire route segment.

It is particularly emphasized that a semiconductor intellectual property database used internally by employees of the entity in ownership has full and complete authority to analyze every region of the design. They are thus unwilling to share that database with supplier/vendors who are likely to serve their competitors.

The method includes displaying by establishing an encrypted channel or private network to a display terminal.

The method includes the steps of writing a LEF/DEF file or its equivalent with only the cells and interconnect within a fault cone or of writing a LEF/DEF file by storing the file on computer readable media in a hashed or encrypted format.

A system and method for performing the invention further comprises a client wherein the client comprises means for querying the server with a certain test data pattern and means for graphically displaying a localized circuit area resulting from the query, A method for practicing the invention has the steps of
a. qualifying through a query-quarantine filter;
b. tracing a signal in a localized design database; and
c. hashing the names discovered in the trace,
whereby certain intellectual property considered to be most secret is prevented from being queried at all and names of cells and interconnect allowed to be traced is reported in a pseudo-randomized disguised form. There can also be imposed a limit on the number of queries—in other words, if a die hard wants to get every piece of the design, they can ask for a SPLAT for every flip-flop and put the whole chip together. The method further comprises setting an adjustable, or default limit set to the number or amount of traces that can be done. For example, when the requests equal ½ of the design, then further access should be limited or permission from the database owner should be requested. Details are left to the corporate security policy of the IP owner.

Hashing the names discovered in the trace comprises hashing the interconnect names, hashing the hierarchical component of a cell name, or hashing the entire hierarchical cell name to a pseudo-random string.

The method of tracing a signal comprises the step of reporting at least one of a cell electrically coupled to a signal, an interconnect element electrically coupled to a signal, and a localized area corresponding to the reported cell or interconnect.

The method of qualifying through a query quarantine filter comprises checking for a stop-trace property associated with physical coordinate, a signal, interconnect, or cell and reporting the localized area of the element having the stop-trace property and terminating the trace at that point.

The present invention further comprises the steps of setting a maximum area of localized failure areas which may be reported by a secure IP server; resetting an accumulator of area of localized failure area; computing the area of a localized failure area reported by a secure IP server; aggregating the area accumulator; comparing the area accumulator with the maximum area; and refusing to service further requests when the area accumulator exceeds the maximum area of localized failure areas.

The present invention further comprises the steps of setting a maximum number of categorized failure requests which a user may submit to a secure IP server; resetting a count of requests for each user; incrementing the count of user requests each time a user submits a request; comparing the count with the maximum number of requests; and refusing to service further requests when the count exceeds the maximum number of categorized failure requests.

CONCLUSION

The present invention allows foundry based failure analysis professionals to improve yield and accelerate volume, quality improvements, and profitability. Rather than waiting for assistance from the design team which may be in a different entity, continent, and time zone, the invention minimizes delay in identifying likely locations for defects causing test failures. By protecting and automating access to semiconductor intellectual property the method of operating a server will allow the semiconductor intellectual property owners to feel that their assets are protected while still enabling their manufacturing partners to be proactive and productive.

To timely resolve manufacturing yield issues economically it is desirable to share limited visibility into semiconductor intellectual property with distant business partners and enable them to analyze circuits in their work day. The present invention enables this by protecting certain aspects of the design preventing further tracing, aliasing names that may disclose intent of the design, and limiting the quantity and quality of information shared with non-employees.

The scope of the invention should be determined by the appended claims and their legal equivalents, rather than the examples given to provide illustrations of presently preferred embodiments.

What is claimed is:

1. A method comprising the following steps:
   receiving a failure and failure type measured on a tester;
   accessing information in an electronic product design, definition and test database;
   tracing interconnect and components in the electronic product design, definition and test database, which interconnect and components potentially contribute to the failure and failure type; and
   storing a localized area of the interconnect and components in which a defect could cause the failure, wherein storing the localized area comprises storing on a non-transitory computer readable electronic media data concerning an origin, length, layer, and direction of wire segments, a location and dimension of vias attached to the wire segments, a location and dimension of pins attached to the wire segments, and an origin, orientation, and dimension of components which potentially contribute to the failure.

2. The method of claim 1 further comprising defining boundaries around semiconductor intellectual property, specified in the electronic product design, definition and test database, that the owner declines to reveal to an unauthorized person and stopping the trace when such a boundary is encountered.

3. The method of claim 1 further comprising the steps of:
   defining a limit at a physical or hierarchical boundary in the electronic product design, definition and test database, beyond which is data desired to be kept confidential;
   checking for the limit before each step of the tracing; and
   terminating the tracing when the limit is reached.

4. The method of claim 1 further comprising displaying graphically an origin of scan cells, an origin of components potentially contributing to a failure in a scan cell, a location of pins on the components, and a location of interconnect elements attached to the pins.

5. The method of claim 1 wherein tracing comprises the following process:
   reading from a library database and storing a geometric shape and size of a cell, a named pin for a cell, a geometric shape and size of a pin of the cell.

6. The method of claim 1 wherein tracing comprises the following process:
   reading from a design database and storing length and metal layer of each segment of a wire route connecting cells in a localized fault region.

7. The method of claim 1 wherein tracing comprises the following process:
   reading from a library database and storing geometric size, and shape of a via connecting a wire route segment from one metal layer to a wire route segment on another metal layer; and
   reading and storing the via's location from a design database.

8. The method of claim 1 wherein tracing comprises at least one of the following methods:
   net-print tracing;
   fan-in tracing;
   fan-out tracing; and
   clock-tree tracing.

9. The method of claim 8 wherein Net-Print Tracing comprises:
   receiving a user specified port of a user specified component;
   storing the user specified component in a Trace output on the non-transitory computer readable electronic media;
   storing a net attached to the port of a first component in the Trace output wherein a net comprises at least one metal wire which connects a component and port (or pin) to at least one of the following: a via, a device pin, and a port on a second component;
   storing a device pin touched by the net in the Trace output; and
   storing a component which has a port touched by the net in the Trace output.

10. The method of claim 8 wherein Fan-In Tracing comprises:
    receiving a user specified port of a user specified component;
    storing the user specified component in a Trace output on the non-transitory computer readable electronic media;
    storing at least one net attached to the port of a component in the Trace output;
    storing a device pin that is touched by the net in the Trace output;
    storing a component which has a port that is touched by the net in the Trace output;
    for a component in the Trace output which is not a scan cell the method further comprises the steps following:
       stopping the trace if the I/O direction of a port of a component is not output; and
       recursively tracing an input to the component if the I/O direction of the port is output.

11. The method of claim 8 wherein Fan-Out Tracing comprises:
    receiving a user specified port of a user specified component;
    storing the user specified component in a Trace output on the non-transitory computer readable electronic media;
    storing a net attached to the specified port in the Trace output;
    storing at least one device pin that is touched by the net in the Trace output
    storing a component that has at least one port that is touched by the net in the Trace output;
    for a component in the trace output which is not a scan cell, the method further comprises the following steps:
       stopping the trace for a port of a component if the I/O direction of the port is not input; and
       recursively tracing all outputs to the component if the I/O direction of the component port is input.

12. The method of claim 8 wherein Clock-Tree Tracing comprises:
    receiving a user specified clock input port of a user specified scan cell component;
    storing the user specified scan cell component in a Trace output on the non-transitory computer readable electronic media;
    storing a net attached to a clock input port of the component in the Trace output;

storing a device pin which is touched by the net in the Trace output;

storing a component which has a port touched by the net in the Trace output;

tracing each input port of each component that has at least one port touched by the net, wherein tracing is the Net-Print Tracing method; and iterating the previous step 'n' times, where 'n' is a user defined "Buffer-Level".

13. The method of claim 12 wherein Clock-Tree Tracing further comprises tracing an output port on a component in the Trace output if it is not a scan cell wherein tracing comprises the an-out tracing.

14. The method of claim 1 further comprising the step of replacing a hierarchical name of each cell instance or each net in the electronic product design, definition and test database with a unique alias name.

15. The method of claim 1 further comprising storing to non-transitory computer readable media a splat wherein a splat comprises:

a location of the origin of a library cell wherein a location is a 2 dimensional geometric coordinate, a height, and a width; and a location of a net wire route segment comprising origin, direction and length.

* * * * *